United States Patent
Yeh et al.

(10) Patent No.: US 10,660,202 B1
(45) Date of Patent: May 19, 2020

(54) CARRIER STRUCTURE AND MANUFACTURING METHOD THEREOF

(71) Applicant: Unimicron Technology Corp., Taoyuan (TW)

(72) Inventors: Wen-Liang Yeh, Hsinchu County (TW); Chun-Hsien Chien, New Taipei (TW); Chien-Chou Chen, Hsinchu County (TW); Cheng-Hui Wu, New Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/221,587

(22) Filed: Dec. 17, 2018

(30) Foreign Application Priority Data

Nov. 16, 2018 (TW) .............................. 107140723 A

(51) Int. Cl.
| | |
|---|---|
| *H05K 1/00* | (2006.01) |
| *H05K 1/02* | (2006.01) |
| *H05K 1/03* | (2006.01) |
| *H05K 1/11* | (2006.01) |
| *H05K 1/18* | (2006.01) |
| *H05K 3/00* | (2006.01) |
| *H05K 3/02* | (2006.01) |
| *H05K 3/10* | (2006.01) |
| *H05K 3/30* | (2006.01) |
| *H05K 3/46* | (2006.01) |

(Continued)

(52) U.S. Cl.
CPC ............ *H05K 1/115* (2013.01); *H05K 1/0306* (2013.01); *H05K 3/0094* (2013.01); *H05K 3/28* (2013.01); *H05K 3/3452* (2013.01); *H05K 2201/2009* (2013.01)

(58) Field of Classification Search
CPC .. H05K 1/00; H05K 1/02; H05K 1/03; H05K 1/11; H05K 1/18; H05K 3/00; H05K 3/02; H05K 3/10; H05K 3/30; H05K 3/46
USPC ....... 174/258, 250, 251, 255–257, 262, 266; 216/13, 16, 19; 428/47, 139, 157, 213, 428/13, 16, 19
See application file for complete search history.

(56) References Cited

U.S. PATENT DOCUMENTS

| | | | |
|---|---|---|---|
| 6,339,197 B1* | 1/2002 | Fushie | ................ H01L 23/5384 174/255 |
| 6,591,495 B2* | 7/2003 | Hirose | ................ H05K 3/0035 174/264 |

(Continued)

FOREIGN PATENT DOCUMENTS

| | | |
|---|---|---|
| TW | I303726 | 12/2008 |
| TW | 200913811 | 3/2009 |

OTHER PUBLICATIONS

"Office Action of Taiwan Counterpart Application", dated May 30, 2019, p. 1-p. 9.

*Primary Examiner* — Xiaoliang Chen
(74) *Attorney, Agent, or Firm* — JCIPRNET

(57) ABSTRACT

A carrier structure including a glass substrate, a buffer layer, and an inner circuit layer is provided. The glass substrate has a first surface, a second surface opposite to the first surface, and at least one through hole penetrating through the glass substrate. The buffer layer is disposed on the first surface and the second surface of the glass substrate. The inner circuit layer is disposed on the buffer layer and in the through hole of the glass substrate. The inner circuit layer exposes a part of the buffer layer.

14 Claims, 4 Drawing Sheets

(51) Int. Cl.
*H05K 3/28* (2006.01)
*H05K 3/34* (2006.01)

(56) References Cited

U.S. PATENT DOCUMENTS

| | | | | |
|---|---|---|---|---|
| 2001/0042637 A1* | 11/2001 | Hirose | ................ | H05K 3/0035 |
| | | | | 174/255 |
| 2004/0079643 A1* | 4/2004 | Ban | ................ | C25D 5/022 |
| | | | | 205/118 |
| 2008/0173473 A1* | 7/2008 | Hirose | ................ | H05K 3/0035 |
| | | | | 174/266 |
| 2010/0139960 A1* | 6/2010 | Ahn | ................ | H05K 3/0032 |
| | | | | 174/258 |
| 2013/0192884 A1* | 8/2013 | Furutani | ................ | H05K 1/185 |
| | | | | 174/258 |
| 2013/0242520 A1* | 9/2013 | Onozuka | ................ | B32B 5/02 |
| | | | | 361/783 |
| 2013/0264101 A1* | 10/2013 | Furuichi | ................ | H05K 1/115 |
| | | | | 174/251 |
| 2014/0027163 A1* | 1/2014 | Min | ................ | H05K 1/0271 |
| | | | | 174/257 |
| 2014/0090878 A1* | 4/2014 | Adachi | ................ | H05K 1/036 |
| | | | | 174/255 |
| 2014/0182897 A1* | 7/2014 | Lee | ................ | H05K 3/002 |
| | | | | 174/251 |
| 2015/0027757 A1* | 1/2015 | Shin | ................ | H05K 3/107 |
| | | | | 174/255 |
| 2015/0195907 A1* | 7/2015 | Chung | ................ | H05K 1/0271 |
| | | | | 174/258 |
| 2015/0313018 A1* | 10/2015 | Maeda | ................ | H01L 23/49822 |
| | | | | 174/255 |
| 2015/0319852 A1* | 11/2015 | Min | ................ | H05K 1/0306 |
| | | | | 361/784 |
| 2015/0373841 A1* | 12/2015 | Cho | ................ | C03B 33/074 |
| | | | | 174/251 |
| 2015/0373842 A1* | 12/2015 | Min | ................ | H05K 1/02 |
| | | | | 428/47 |
| 2016/0128186 A1* | 5/2016 | Cho | ................ | H05K 1/0271 |
| | | | | 174/258 |
| 2016/0135289 A1* | 5/2016 | Cho | ................ | H05K 1/0271 |
| | | | | 174/251 |
| 2016/0374198 A1* | 12/2016 | Kim | ................ | H05K 1/0271 |
| 2017/0018492 A1* | 1/2017 | Imayoshi | ................ | H01L 21/486 |
| 2018/0035534 A1* | 2/2018 | Taniguchi | ................ | H05K 3/4688 |
| 2018/0042124 A1* | 2/2018 | Makino | ................ | H05K 1/16 |

* cited by examiner

CARRIER STRUCTURE AND MANUFACTURING METHOD THEREOF

CROSS-REFERENCE TO RELATED APPLICATION

This application claims the priority benefit of Taiwan application serial no. 107140723, filed on Nov. 16, 2018. The entirety of the above-mentioned patent application is hereby incorporated by reference herein and made a part of this specification.

BACKGROUND

Technical Field

The invention relates to a carrier structure and a manufacturing method thereof, and particularly relates to a carrier structure with a buffer layer and a manufacturing method thereof.

Description of Related Art

At present, glass substrates are widely applied to high-order demand substrates or intermediate substrate materials of interposers due to their special surface flatness. However, due to its fragile nature, in a conventional substrate manufacturing process, for example, a Semi-Additive Process (SAP), after a thick copper inner circuit is fabricated on a surface of the glass substrate, it is easy to produce micro cracks that are small and difficult to detect by naked eyes or microscope due to stress, such that the thick copper inner circuit is easy to separate from the glass substrate, which results in a fact that the glass substrate cannot pass through verification of reliability (for example, TCT, HAST or PCT, etc.).

SUMMARY

The invention is directed to a carrier structure, which has a circuit layer on a surface of a glass substrate thereof, and has good reliability.

The invention is directed to a manufacturing method of a carrier structure, which is adapted to manufacture the aforementioned carrier structure to avoid producing micro cracks on a glass substrate, and improve adhesion ability of a circuit layer on a surface of the glass substrate.

The invention provides a carrier structure including a glass substrate, a buffer layer, and an inner circuit layer. The glass substrate has a first surface, a second surface opposite to the first surface, and at least one through hole penetrating through the glass substrate. The buffer layer is disposed on the first surface and the second surface of the glass substrate. The inner circuit layer is disposed on the buffer layer and in the through hole of the glass substrate.

The inner circuit layer exposes a part of the buffer layer.

In an embodiment of the invention, the inner circuit layer and the glass substrate are respectively located at two opposite sides of the buffer layer.

In an embodiment of the invention, the buffer layer directly contacts the glass substrate. The buffer layer completely covers the first surface and the second surface of the glass substrate.

In an embodiment of the invention, the carrier structure further includes a first dielectric layer and a second dielectric layer, at least one first conductive via, a first circuit layer, at least one second conductive via and a second circuit layer. The first dielectric layer and the second dielectric layer are disposed on the glass substrate and fill up the through hole. The first dielectric layer covers the first surface and a part of the inner circuit layer, and the second dielectric layer covers the second surface and a part of the inner circuit layer. The first conductive via penetrates through the first dielectric layer. The first circuit layer is disposed on the first dielectric layer, and is electrically connected to the inner circuit layer through the first conductive via. The second conductive via penetrates through the second dielectric layer. The second circuit layer is disposed on the second dielectric layer, and is electrically connected to the inner circuit layer through the second conductive via.

In an embodiment of the invention, the carrier structure further includes a first solder mask layer and a second solder mask layer. The first solder mask layer is disposed on the first dielectric layer, and covers the first dielectric layer and a part of the first circuit layer. The second solder mask layer is disposed on the second dielectric layer, and covers the second dielectric layer and a part of the second circuit layer.

In an embodiment of the invention, the buffer layer is disposed in the through hole of the glass substrate, and is located between the inner circuit layer and the glass substrate.

In an embodiment of the invention, a material of the buffer layer includes an inorganic material or an organic polymer material.

In an embodiment of the invention, a thickness of the buffer layer is between 10 nm and 50 µm.

In an embodiment of the invention, a thickness of the inner circuit layer is between 1 µm and 30 µm.

The invention provides a manufacturing method of a carrier structure including following steps. First, a glass substrate is provided. The glass substrate has a first surface, a second surface opposite to the first surface, and at least one through hole penetrating through the glass substrate. Then, a buffer layer is formed on the first surface and the second surface of the glass substrate. Then, an inner circuit layer is formed on the buffer layer and in the through hole of the glass substrate, where the inner circuit layer exposes a part of the buffer layer.

In an embodiment of the invention, the manufacturing method of the carrier structure further includes following steps. First, a first dielectric layer and a second dielectric layer are pressed to the glass substrate and fill up the through hole, where the first dielectric layer covers the first surface and a part of the inner circuit layer, and the second dielectric layer covers the second surface and a part of the inner circuit layer. Then, at least one first conductive via is formed, and the first conductive via penetrates through the first dielectric layer. Thereafter, a first circuit layer is formed on the first dielectric layer, and the first circuit layer is electrically connected to the inner circuit layer through the first conductive via. Then, at least one second conductive via is formed, and the second conductive via penetrates through the second dielectric layer. Then, a second circuit layer is formed on the second dielectric layer, and the second circuit layer is electrically connected to the inner circuit layer through the second conductive via.

In an embodiment of the invention, the manufacturing method of the carrier structure further includes following steps. First, a first solder mask layer is formed on the first dielectric layer, and the first solder mask layer covers the first dielectric layer and a part of the first circuit layer. Then, a second solder mask layer is formed on the second dielectric layer, and the second solder mask layer covers the second dielectric layer and a part of the second circuit layer.

Based on the above description, in the carrier structure and the manufacturing method thereof, the carrier structure includes the glass substrate, the buffer layer and the inner circuit layer, the buffer layer is disposed on the first surface and the second surface of the glass substrate, the inner circuit layer is disposed on the buffer layer and in the through hole of the glass substrate, and the inner circuit layer exposes a part of the buffer layer. Based on such design, the carrier structure has a circuit layer on the surface of the glass substrate thereof, and has good reliability. Moreover, the manufacturing method of the carrier structure of the invention is also able to avoid producing micro cracks on the glass substrate, and improve adhesion ability of the circuit layer on the surface of the glass substrate.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1E are cross-sectional views of a manufacturing method of a carrier structure according to an embodiment of the invention.

Figure 1A:
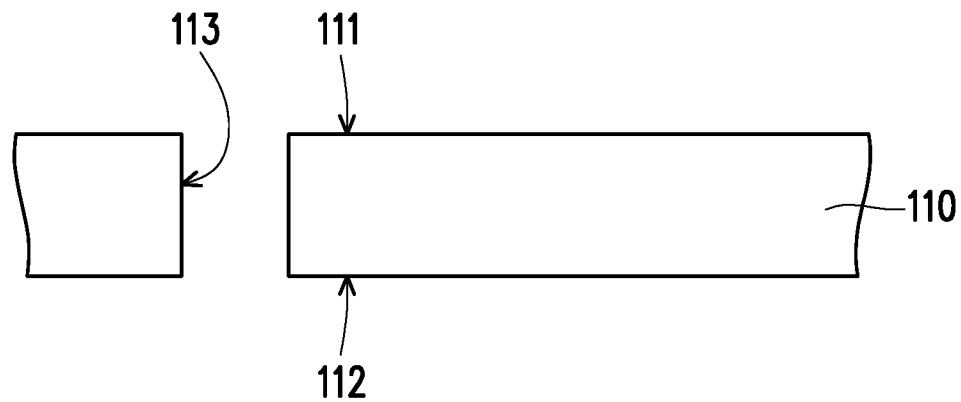
FIG. 1A to FIG. 1E are cross-sectional views of a manufacturing method of a carrier structure according to an embodiment of the invention.

First, referring to FIG. 1A, in the embodiment, a glass substrate 110 is provided. In detail, the glass substrate 110 has a first surface 111, a second surface 112 opposite to the first surface 111, and at least one through hole 113 (one is schematically illustrated in FIG. 1A, though the invention is not limited thereto) penetrating through the glass substrate 110. The through hole 113 connects the first surface 111 and the second surface 112. In the embodiment, a method of forming the through hole 113 is, for example, to drill the glass substrate 110 in a laser manner, though the invention is not limited thereto.

Figure 1B:
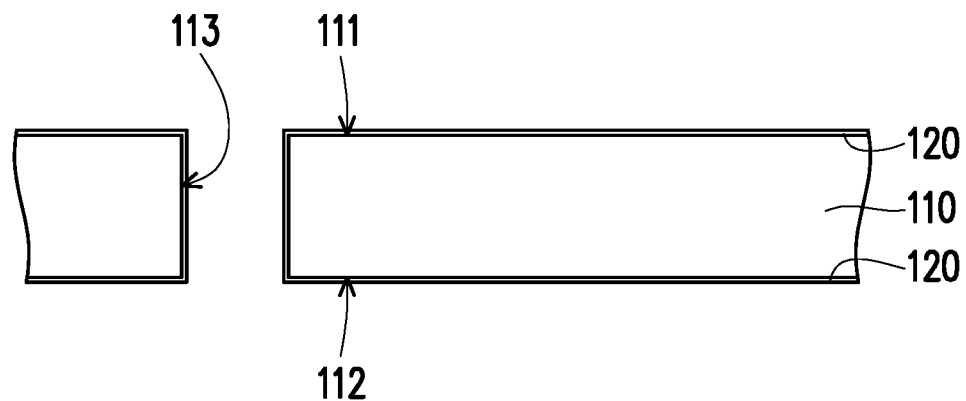

Then, referring to FIG. 1B, in the embodiment, a buffer layer 120 is formed on the first surface 111 and the second surface 112 and in the through hole 113 of the glass substrate 110. The buffer layer 120 may directly contact the glass substrate 110, and the buffer layer 120 may completely cover the first surface 111 and the second surface 112 of the glass substrate 110. In detail, in the embodiment, the buffer layer 120 is formed on the glass substrate 110 through, for example, a sputtering or coating manner, though the invention is not limited thereto. The coating manner is, for example, a physical vapour deposition method or an immersion method, etc., or a slit coater is adopted to implement the coating, though the invention is not limited thereto. In the embodiment, a thickness of the buffer layer 120 may be between 10 nm and 50 µm. In the embodiment, a material of the buffer layer 120 is, for example, an inorganic material or an organic polymer material. In some embodiments, the material of the buffer layer 120 may be a non-conductor oxide or an insulating material. For example, the material of the buffer layer 120 may be silicon dioxide or ABF resin, though the invention is not limited thereto.

Figure 1C:
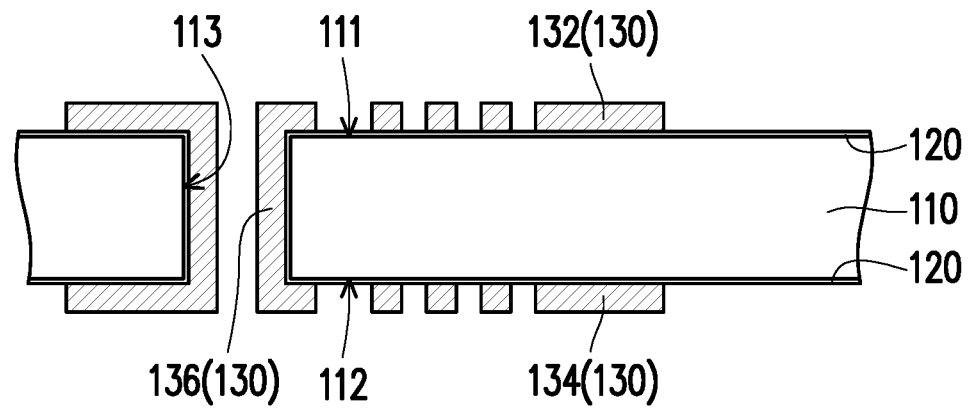

Then, referring to FIG. 1C, in the embodiment, an inner circuit layer 130 is formed on the buffer layer 120 and in the through hole 113 of the glass substrate 110, where the inner circuit layer 130 exposes a part of the buffer layer 120. In detail, in the embodiment, the inner circuit layer 130 include a first inner circuit layer 132, a second inner circuit layer 134 and a third inner circuit layer 136. The first inner circuit layer 132 is formed on the buffer layer 120 of the first surface 111 of the glass substrate 110, the second inner circuit layer 134 is formed on the buffer layer 120 of the second surface 112 of the glass substrate 110, and the third inner circuit layer 136 is formed in the through hole 113 of the glass substrate 110. The first inner circuit layer 132 and the glass substrate 110 are respectively located at two opposite sides of the buffer layer 120, the second inner circuit layer 134 and the glass substrate 110 are respectively located at two opposite sides of the buffer layer 120, and the buffer layer 120 in the through hole 113 is located between the third inner circuit layer 136 and the glass substrate 110. Moreover, the first inner circuit layer 132 exposes a part of the buffer layer 120 on the first surface 111, and the second inner circuit layer 134 exposes a part of the buffer layer 120 on the second surface 112. In the embodiment, the inner circuit layer 130 is, for example, formed through electroplating, which includes following steps: a seed layer is first formed on the first surface 111, the second surface 112 and in the through hole 113 of the glass substrate 110, and then a patterned photoresist layer is formed, and a conductive material is adopted to perform the electroplating, and finally the patterned photoresist layer and the seed layer under the patterned photoresist layer are removed to complete fabricating the inner circuit layer 130. The conductive material is, for example, copper, and a thickness of the formed inner circuit layer 130 is, for example, between 1 µm and 30 µm. It should be noted that although the inner circuit layer 130 is formed through the aforementioned steps, the invention is not limited thereto.

Figure 1D:
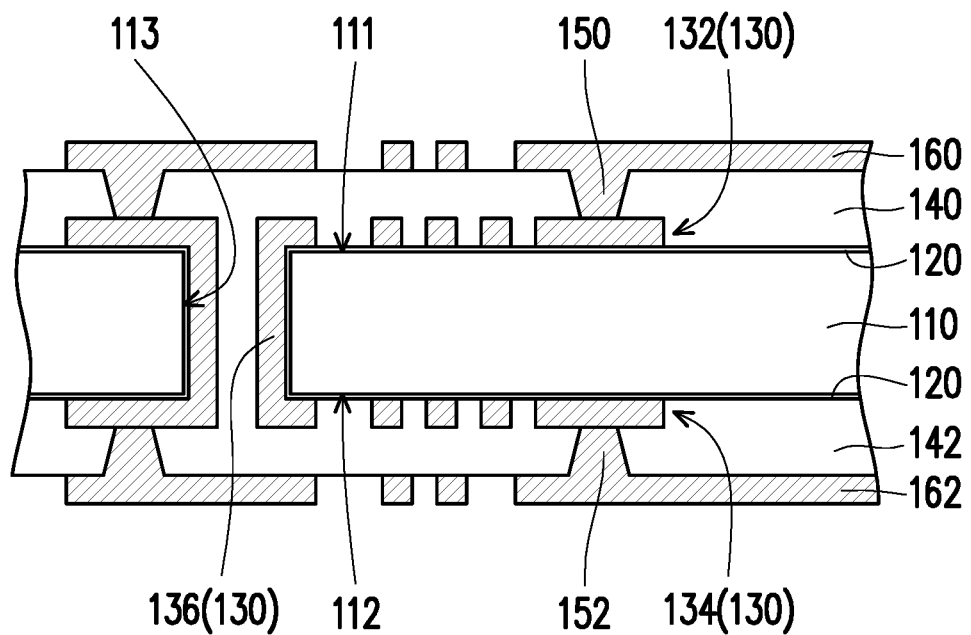

Thereafter, referring to FIG. 1D, in the embodiment, one layer of or multiple layers of circuit layers may be further fabricated on the inner circuit layer 130. In the embodiment, one layer of the circuit layer is, for example, formed on the first inner circuit layer 132 and the second inner circuit layer 134, which, for example, includes following steps: first, a first dielectric layer 140 and a second dielectric layer 142 are pressed to the glass substrate 110 and fill up the through hole 113, such that the first dielectric layer 140 covers the first surface 111 and the first inner circuit layer 132, and the second dielectric layer 142 covers the second surface 112 and the second inner circuit layer 134. Then, at least one first conductive via 150 is formed (two first conductive vias are schematically illustrated in FIG. 1D, though the invention is not limited thereto), and the first conductive vias 150 penetrate through the first dielectric layer 140. At least one second conductive via 152 is formed (two second conductive vias are schematically illustrated in FIG. 1D, though the invention is not limited thereto), and the second conductive vias 152 penetrate through the second dielectric layer 142. Thereafter, a first circuit layer 160 is formed on the first dielectric layer 140, and the first circuit layer 160 is electrically connected to the first inner circuit layer 132 through the first conductive via 150. A second circuit layer 162 is formed on the second dielectric layer 152, and the second circuit layer 162 is electrically connected to the second inner circuit layer 134 through the second conductive via 152. In the embodiment, the first circuit layer 160 and the second circuit layer 162 are, for example, formed through electroplating, and the method and steps thereof are similar to the aforementioned method and steps for forming the inner circuit layer 130, and details thereof are not repeated.

Figure 1E:
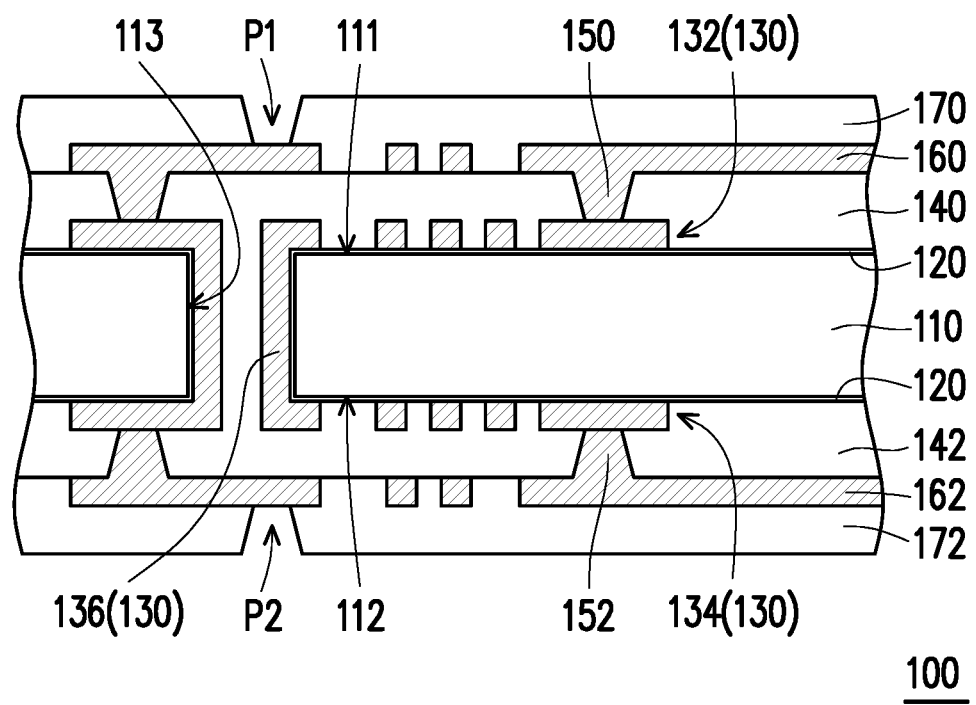

Finally, referring to FIG. 1E, in the embodiment, a first solder mask layer 170 is formed on the first dielectric layer 140, and a second solder mask layer 172 is formed on the second dielectric layer 142, where the first solder mask layer 170 covers the first dielectric layer 140 and a part of the first circuit layer 160 and exposes a part of the first circuit layer 160. The second solder mask layer 172 covers the second dielectric layer 142 and a part of the second circuit layer 162 and exposes a part of the second circuit layer 162. Therefore, a part of the first circuit layer 160 exposed by the first solder mask layer 170 may be defined as a first pad P1, and a part of the second circuit layer 162 exposed by the second solder mask layer 172 may be defined as a second pad P2. Therefore, the carrier structure 100 may be electrically connected to an external circuit through the first pad P1 and the second pad P2. Now, fabrication of the carrier structure 100 of the embodiment is completed.

In brief, in the carrier structure 100 of the embodiment, the carrier structure 100 includes the glass substrate 110, the buffer layer 120 and the inner circuit layer 130. The glass substrate 110 has the first surface 111, the second surface 112 opposite to the first surface 111 and the through hole 113 penetrating through the glass substrate 110. The buffer layer 120 is disposed on the first surface 111 and the second surface 112 of the glass substrate 110. The inner circuit layer 130 is disposed on the buffer layer 120 and in the through hole of the glass substrate 110. The inner circuit layer 130 exposes a part of the buffer layer 120. Based on such design, the carrier structure 100 of the embodiment may have the inner circuit layer 130 on the surface of the glass substrate 110 thereof, and has good reliability. Moreover, the manufacturing method of the carrier structure of the invention is also able to avoid producing micro cracks on the glass substrate 110, and improve adhesion ability of the inner circuit layer 130 on the surface of the glass substrate 110.

Other embodiments are provided below for further description. It should be noticed that reference numbers of the components and a part of contents of the aforementioned embodiment are also used in the following embodiment, wherein the same reference numbers denote the same or like components, and descriptions of the same technical contents are omitted. The aforementioned embodiment may be referred for descriptions of the omitted parts, and detailed descriptions thereof are not repeated in the following embodiment.

Figure 2:
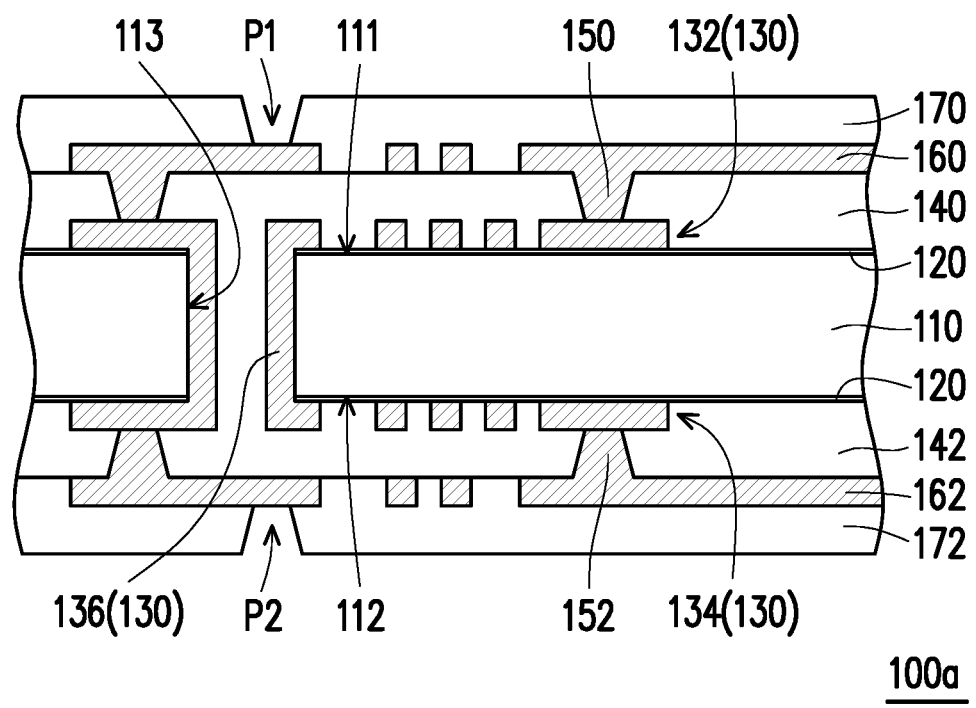
FIG. 2 is a cross-sectional view of a carrier structure according to another embodiment of the invention.

FIG. 2 is a cross-sectional view of a carrier structure according to another embodiment of the invention. Referring to FIG. 1E and FIG. 2, the carrier structure 100a of the embodiment is similar to the carrier structure 100 of FIG. 1E, and a main difference there between is that in the carrier structure 100a of the embodiment, the buffer layer 120 is not formed in the through hole 113 of the glass substrate 110. Namely, none buffer layer existed between the third inner circuit layer 136 and the glass substrate 110 in the through hole 113, such that the third inner circuit layer 136 may directly contact the glass substrate 110 in the through hole 113.

In summary, in the carrier structure and the manufacturing method thereof, the carrier structure includes the glass substrate, the buffer layer and the inner circuit layer, where the buffer layer is disposed on the first surface and the second surface of the glass substrate, the inner circuit layer is disposed on the buffer layer and in the through hole of the glass substrate, and the inner circuit layer exposes a part of the buffer layer. Based on such design, the carrier structure has a circuit layer on the surface of the glass substrate thereof, and has good reliability. Moreover, the manufacturing method of the carrier structure of the invention is also able to avoid producing micro cracks on the glass substrate, and improve adhesion ability of the circuit layer on the surface of the glass substrate.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:
1. A carrier structure, comprising:
   a glass substrate, having a first surface, a second surface opposite to the first surface, and at least one through hole penetrating through the glass substrate;
   a buffer layer, disposed on the first surface and the second surface of the glass substrate;
   an inner circuit layer, disposed on the buffer layer and in the through hole of the glass substrate, wherein the inner circuit layer exposes a part of the buffer layer, and a thickness of the buffer layer is less than a thickness of the inner circuit layer;
   a first dielectric layer and a second dielectric layer, disposed on the glass substrate and filling up the through hole, wherein the first dielectric layer covers the first surface and a part of the inner circuit layer, and the second dielectric layer covers the second surface and a part of the inner circuit layer;
   at least one first conductive via, penetrating through the first dielectric layer;
   a first circuit layer, disposed on the first dielectric layer, and electrically connected to the inner circuit layer through the first conductive via;
   at least one second conductive via, penetrating through the second dielectric layer; and
   a second circuit layer, disposed on the second dielectric layer, and electrically connected to the inner circuit layer through the second conductive via.

2. The carrier structure as claimed in claim 1, wherein the inner circuit layer and the glass substrate are respectively located at two opposite sides of the buffer layer.

3. The carrier structure as claimed in claim 1, wherein the buffer layer directly contacts the glass substrate, and the buffer layer completely covers the first surface and the second surface of the glass substrate.

4. The carrier structure as claimed in claim 1, further comprising:
   a first solder mask layer, disposed on the first dielectric layer, and covering the first dielectric layer and a part of the first circuit layer; and
   a second solder mask layer, disposed on the second dielectric layer, and covering the second dielectric layer and a part of the second circuit layer.

5. The carrier structure as claimed in claim 1, wherein the buffer layer is disposed in the through hole of the glass substrate, and is located between the inner circuit layer and the glass substrate.

6. The carrier structure as claimed in claim 1, wherein a material of the buffer layer comprises an inorganic material or an organic polymer material.

7. The carrier structure as claimed in claim 1, wherein a thickness of the inner circuit layer is between 1 µm and 30 µm.

8. A manufacturing method of a carrier structure, comprising:

providing a glass substrate, wherein the glass substrate has a first surface, a second surface opposite to the first surface, and at least one through hole penetrating through the glass substrate;

forming a buffer layer on the first surface and the second surface of the glass substrate;

forming an inner circuit layer on the buffer layer and in the through hole of the glass substrate, wherein the inner circuit layer exposes a part of the buffer layer, and a thickness of the buffer layer is less than a thickness of the inner circuit layer;

pressing a first dielectric layer and a second dielectric layer to the glass substrate and filling up the through hole, wherein the first dielectric layer covers the first surface and a part of the inner circuit layer, and the second dielectric layer covers the second surface and a part of the inner circuit layer;

forming at least one first conductive via, wherein the first conductive via penetrates through the first dielectric layer;

forming a first circuit layer on the first dielectric layer, wherein the first circuit layer is electrically connected to the inner circuit layer through the first conductive via;

forming at least one second conductive via, wherein the second conductive via penetrates through the second dielectric layer; and forming a second circuit layer on the second dielectric layer, wherein the second circuit layer is electrically connected to the inner circuit layer through the second conductive via.

9. The manufacturing method of the carrier structure as claimed in claim 8, wherein the inner circuit layer and the glass substrate are respectively located at two opposite sides of the buffer layer.

10. The manufacturing method of the carrier structure as claimed in claim 8, wherein the buffer layer directly contacts the glass substrate, and the buffer layer completely covers the first surface and the second surface of the glass substrate.

11. The manufacturing method of the carrier structure as claimed in claim 8, further comprising:

forming a first solder mask layer on the first dielectric layer, wherein the first solder mask layer covers the first dielectric layer and a part of the first circuit layer; and forming a second solder mask layer on the second dielectric layer, wherein the second solder mask layer covers the second dielectric layer and a part of the second circuit layer.

12. The manufacturing method of the carrier structure as claimed in claim 8, wherein the buffer layer is disposed in the through hole of the glass substrate, and is located between the inner circuit layer and the glass substrate.

13. The manufacturing method of the carrier structure as claimed in claim 8, wherein a material of the buffer layer comprises an inorganic material or an organic polymer material.

14. The manufacturing method of the carrier structure as claimed in claim 8, wherein a thickness of the inner circuit layer is between 1 µm and 30 µm.

* * * * *